US012625176B2

(12) United States Patent
Hasegawa et al.

(10) Patent No.: US 12,625,176 B2
(45) Date of Patent: May 12, 2026

(54) TESTING APPARATUS, TESTING METHOD, AND COMPUTER-READABLE STORAGE MEDIUM

(71) Applicant: ADVANTEST CORPORATION, Tokyo (JP)

(72) Inventors: Kotaro Hasegawa, Saitama (JP); Koji Miyauchi, Gunma (JP)

(73) Assignee: ADVANTEST CORPORATION, Tokyo (JP)

( * ) Notice: Subject to any disclaimer, the term of this patent is extended or adjusted under 35 U.S.C. 154(b) by 221 days.

(21) Appl. No.: 18/539,320

(22) Filed: Dec. 14, 2023

(65) Prior Publication Data

US 2024/0110969 A1      Apr. 4, 2024

Related U.S. Application Data

(63) Continuation of application No. PCT/JP2022/020674, filed on May 18, 2022.

(30) Foreign Application Priority Data

Sep. 8, 2021      (JP) ................................. 2021-145919

(51) Int. Cl.
*G01R 31/26*      (2020.01)
*G01R 31/28*      (2006.01)

(52) U.S. Cl.
CPC ..... *G01R 31/2635* (2013.01); *G01R 31/2894* (2013.01)

(58) Field of Classification Search
CPC .. G01R 31/26; G01R 31/265; G01R 31/2635; G01R 31/27; G01R 31/275; G01R 23/00;
(Continued)

(56) References Cited

U.S. PATENT DOCUMENTS 6,377,300 B1      4/2002  Morris
2004/0173732 A1      9/2004  Rogers
(Continued)

FOREIGN PATENT DOCUMENTS

CN      101013544 A      8/2007
CN      103364707 A      10/2013
(Continued)

OTHER PUBLICATIONS

Office Action issued for related Korean Application 10-2021-0178758, issued by the Korean Intellectual Property Office on Mar. 29, 2024.

(Continued)

*Primary Examiner* — Son T Le

(57) ABSTRACT

Provided is a testing apparatus including: a light emission control unit which causes a plurality of light emitting elements to be tested to emit light; a light measurement unit which receives the light emitted from the plurality of light emitting elements and measures wavelengths of the received light; and a determination unit which determines whether there is an abnormality in at least one light emitting element on the basis of intensity distributions of the wavelengths of the light, which is emitted from the plurality of light emitting elements, measured by the light measurement unit. The testing apparatus may further include: a light source; an optical system which irradiates the plurality of light emitting elements with light emitted from the light source; and an electrical measurement unit which measures a photoelectric signal obtained by each of the plurality of light emitting elements photoelectrically converting the light radiated by the optical system.

15 Claims, 7 Drawing Sheets

(58) Field of Classification Search
CPC ........ G01R 23/17; G01R 23/18; G01R 31/28;
G01R 31/2894; H01J 27/24; H01J 3/024;
H10H 20/80; H01L 22/00; G01J 1/42;
G01J 1/0228; G01J 1/0411; G01J 1/0425;
G01J 1/08; G01J 2001/4252
See application file for complete search history.

(56) References Cited

U.S. PATENT DOCUMENTS

| | | |
|---|---|---|
| 2004/0257358 A1 | 12/2004 | Okamoto |
| 2005/0194990 A1 | 9/2005 | Gothoskar |
| 2007/0176865 A1 | 8/2007 | Chino |
| 2007/0285378 A1 | 12/2007 | Lankhorst |
| 2010/0208261 A1 | 8/2010 | Sens |
| 2010/0265064 A1 | 10/2010 | Mayer |
| 2013/0015331 A1 | 1/2013 | Birk |
| 2013/0021054 A1 | 1/2013 | Voltan |
| 2013/0027543 A1 | 1/2013 | Boeykens |
| 2013/0201321 A1 | 8/2013 | Chao |
| 2013/0328487 A1 | 12/2013 | Yoshida |
| 2015/0015890 A1 | 1/2015 | Zheng |
| 2015/0019168 A1 | 1/2015 | Masayuki |
| 2015/0078530 A1 | 3/2015 | Hawver |
| 2015/0253388 A1 | 9/2015 | Masuda |
| 2016/0073467 A1 | 3/2016 | Mcdonald |
| 2016/0161294 A1* | 6/2016 | Ip ............................ G01J 3/465 |
| | | 250/578.1 |
| 2016/0161418 A1 | 6/2016 | Yeo |
| 2016/0306042 A1 | 10/2016 | Schrank |
| 2016/0329864 A1 | 11/2016 | Tu |
| 2017/0181384 A1 | 6/2017 | Zhu |
| 2017/0212047 A1 | 7/2017 | Eura |
| 2017/0264876 A1 | 9/2017 | Gaiduk |
| 2018/0254226 A1 | 9/2018 | Iguchi |
| 2018/0276812 A1 | 9/2018 | Kohyama |
| 2018/0352619 A1 | 12/2018 | Weber |
| 2019/0021233 A1 | 1/2019 | Hamby |
| 2019/0133010 A1 | 5/2019 | Sakurayama |
| 2019/0200424 A1 | 6/2019 | Mochizuki |
| 2019/0204235 A1 | 7/2019 | Nishizawa |
| 2019/0259343 A1 | 8/2019 | Masaaki |
| 2019/0293570 A1 | 9/2019 | Kobayashi |
| 2020/0096389 A1 | 3/2020 | Ikemura |
| 2020/0111926 A1 | 4/2020 | Shr |
| 2020/0174377 A1 | 6/2020 | Osaka |
| 2020/0194616 A1 | 6/2020 | Henley |
| 2020/0267810 A1 | 8/2020 | Chemel |
| 2020/0371152 A1 | 11/2020 | Lin |
| 2020/0379029 A1 | 12/2020 | Hasegawa |
| 2020/0386805 A1 | 12/2020 | Kasai |
| 2021/0050553 A1 | 2/2021 | Ogawa |
| 2021/0270752 A1 | 9/2021 | Suzuki |
| 2022/0037213 A1 | 2/2022 | Lee |
| 2022/0178837 A1 | 6/2022 | Nakamura |
| 2022/0276090 A1 | 9/2022 | Hasegawa |
| 2024/0110969 A1 | 4/2024 | Hasegawa |

FOREIGN PATENT DOCUMENTS

| | | |
|---|---|---|
| CN | 103370802 A | 10/2013 |
| CN | 203225042 U | 10/2013 |
| CN | 104344944 A | 2/2015 |
| CN | 105556949 A | 5/2016 |
| CN | 106057696 A | 10/2016 |
| CN | 103620294 B | 2/2017 |
| CN | 106461463 A | 2/2017 |
| CN | 106605162 A | 4/2017 |
| CN | 107617582 A | 1/2018 |
| CN | 109076728 A | 12/2018 |
| CN | 110082068 A | 8/2019 |
| CN | 110440716 A | 11/2019 |
| CN | 110496799 A | 11/2019 |
| CN | 210690739 U | 6/2020 |
| CN | 112151426 A | 12/2020 |
| CN | 112334761 A | 2/2021 |
| CN | 116897290 A | 10/2023 |
| EP | 2439517 A1 | 4/2012 |
| EP | 3812747 A1 | 4/2021 |
| JP | S6161478 A | 3/1986 |
| JP | H081995 A | 1/1996 |
| JP | 2005032704 A | 2/2005 |
| JP | 2006098054 A | 4/2006 |
| JP | 2006215211 A | 8/2006 |
| JP | 2007528129 A | 10/2007 |
| JP | 2010230568 A | 10/2010 |
| JP | 2012084883 A | 4/2012 |
| JP | 2013113635 A | 6/2013 |
| JP | 2015119344 A | 6/2015 |
| JP | 2015169524 A | 9/2015 |
| JP | 2017506459 A | 2/2017 |
| JP | 6249513 B1 | 12/2017 |
| JP | 2017223969 A | 12/2017 |
| JP | 6462843 B1 | 1/2019 |
| JP | 6489421 B2 | 3/2019 |
| JP | 2019040192 A | 3/2019 |
| JP | 2019507953 A | 3/2019 |
| JP | 2020167433 A | 10/2020 |
| JP | 2020197430 A | 12/2020 |
| JP | 2020201086 A | 12/2020 |
| KR | 20090091249 A | 8/2009 |
| KR | 101112193 B1 | 2/2012 |
| KR | 20130102268 A | 9/2013 |
| TW | 200422597 A | 11/2004 |
| TW | 200925565 A | 6/2009 |
| TW | 201243310 A | 11/2012 |
| TW | 201316013 A1 | 4/2013 |
| TW | 201350351 A | 12/2013 |
| TW | 201528867 A | 7/2015 |
| TW | 201712353 A | 4/2017 |
| TW | 201928307 A | 7/2019 |
| TW | 201938381 A | 10/2019 |
| TW | 202015329 A | 4/2020 |
| TW | 202023069 A | 6/2020 |
| TW | 202029369 A | 8/2020 |
| TW | 202036838 A | 10/2020 |
| WO | 2015045222 A1 | 4/2015 |
| WO | 2015107656 A1 | 7/2015 |
| WO | 2016147266 A | 9/2016 |
| WO | 2018062633 A1 | 4/2018 |
| WO | 2018083928 A1 | 5/2018 |

OTHER PUBLICATIONS

Office Action issued for related Korean Application 10-2021-0180619, issued by the Korean Intellectual Property Office on Mar. 18, 2024.

International Search Report and Written Opinion (ISA/237) of the International Search Authority for International Patent Application No. PCT/JP2022/020674, mailed by the Japan Patent Office on Aug. 9, 2022.

Office Action issued for counterpart Japanese Application No. 2021-145919, transmitted by the Japanese Patent Office on Jul. 11, 2023 (drafted on Jul. 4, 2023).

Office Action counterpart for related Taiwanese Application 111128100, transmitted from the Taiwan Intellectual Property Office on Apr. 13, 2023 (issued on Apr. 10, 2023).

Office Action issued for related Japanese Application No. 2021-003813, transmitted by the Japanese Patent Office on Jun. 20, 2023 (drafted on Jun. 15, 2023).

Office Action issued for related Japanese Application No. 2021-003813, transmitted from the Japanese Patent Office on Aug. 8, 2023 (drafted on Aug. 1, 2023).

Office Action issued for related Taiwanese Application 110148130, transmitted from the Taiwan Intellectual Property Office on Jan. 7, 2023 (issued on Jan. 4, 2023).

Office Action issued for related Taiwanese Application 112116170, transmitted from the Taiwan Intellectual Property Office on Jul. 14, 2023 (issued on Jul. 11, 2023).

Office Action issued for related Taiwanese Application 110149281, transmitted from the Taiwan Intellectual Property Office on Nov. 17, 2022 (issued on Nov. 14, 2022).

(56) References Cited

OTHER PUBLICATIONS

Office Action issued for related Japanese Application No. 2021-007928, transmitted from the Japanese Patent Office on Aug. 22, 2023 (drafted on Aug. 16, 2023).

Office Action issued for related Taiwanese Application 110148320, transmitted from the Taiwan Intellectual Property Office on Sep. 12, 2022 (issued on Sep. 6, 2022).

Office Action issued for related Chinese Application 202111470510. 1, issued by The State Intellectual Property Office of People's Republic of China on Dec. 31, 2024.

Office Action issued for related Japanese Application No. 2023-183582, transmitted from the Japanese Patent Office on May 21, 2024 (drafted on May 13, 2024).

Office Action issued for related Chinese Application 202111613077. 2, issued by The State Intellectual Property Office of People's Republic of China on Oct. 24, 2024.

Office Action issued for related Chinese Application 202111470510. 1, issued by The State Intellectual Property Office of People's Republic of China on Sep. 19, 2025.

* cited by examiner

100

100

TESTING APPARATUS, TESTING METHOD, AND COMPUTER-READABLE STORAGE MEDIUM

The contents of the following patent application(s) are incorporated herein by reference:
NO. 2021-145919 filed in JP on Sep. 8, 2021
NO. PCT/JP2022/020674 filed in WO on May 18, 2022

BACKGROUND

1. Technical Field

The present invention relates to a testing apparatus, a testing method, and a computer-readable storage medium.

2. Related Art

A method is known in which one of a pair of LEDs to be inspected is caused to emit light and the other is caused to receive the light, and a current value of a current output by a photoelectric effect is used to inspect optical characteristics of the LEDs (see, for example, Patent Documents 1 and 2).

CITATION LIST

Patent Document

Patent Document 1: Japanese translation publication of a PCT rout patent application No. 2019-507953
Patent Document 2: Japanese Patent Application Publication No. 2010-230568

DESCRIPTION OF EXEMPLARY EMBODIMENTS

Hereinafter, the present invention will be described through embodiments of the present invention, but the following embodiments do not limit the present invention according to claims. In addition, not all combinations of features described in the embodiment are essential to the solution of the invention.

Figure 1:
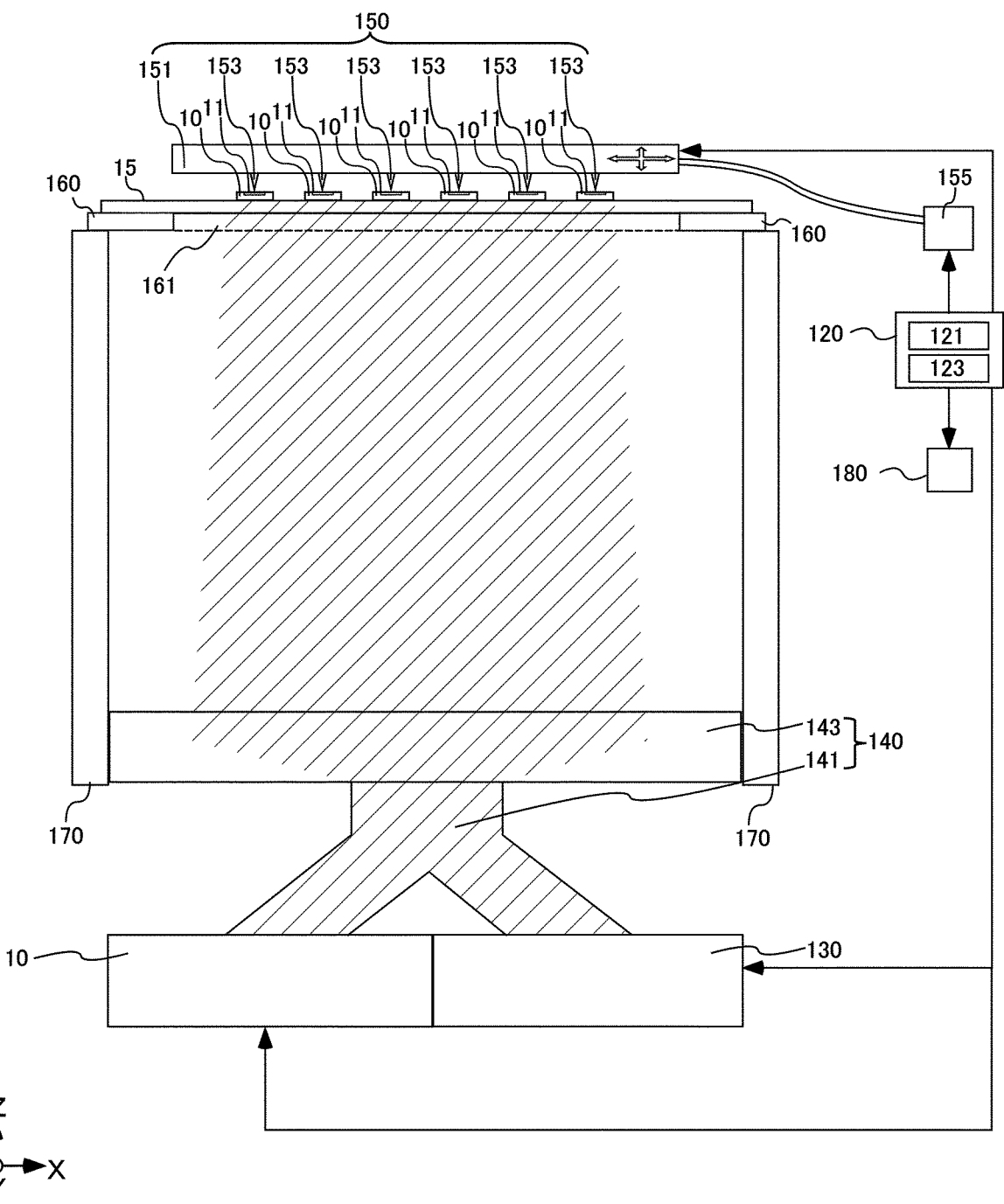
FIG. 1 is an example of a general view showing a schematic of a testing apparatus 100 for testing a plurality of LEDs 10.
Figure 2:
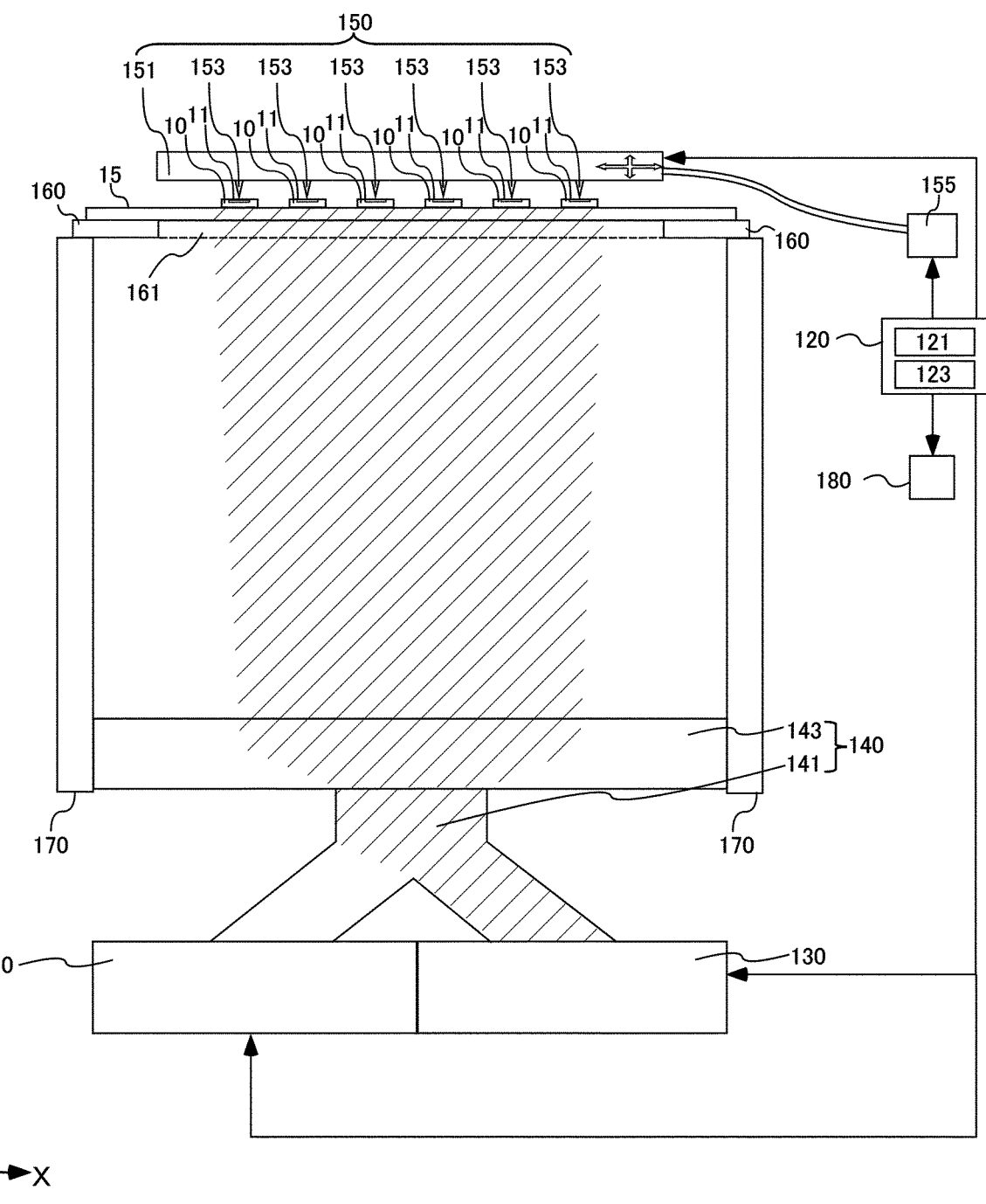
FIG. 2 is an example of a general view showing a schematic of the testing apparatus 100 for testing the plurality of LEDs 10.

FIGS. 1 and 2 are examples of a general view showing a schematic of a testing apparatus 100 for testing a plurality of LEDs 10. In FIGS. 1 and 2, an X axis, which is a +X direction in a rightward direction with respect to a paper surface, a Z axis, which is a +Z direction in an upward direction with respect to the paper surface, and a Y axis, which is a +Y direction in a depth direction with respect to the paper surface, are illustrated so as to be orthogonal to each other. Hereinafter, description may be given by using these three axes.

In FIGS. 1 and 2, a flow of a control signal is indicated by a black arrow. In addition, in FIGS. 1 and 2, a moving direction of an electrical connection unit 150 is indicated by a white arrow. In addition, in FIG. 1, the light emitted from the plurality of LEDs 10 is indicated by hatching, and similarly, in FIG. 2, the light emitted from the light source 130 is indicated by hatching. In FIGS. 1 and 2, a through hole 161 of a placement unit 160 is indicated by a broken line.

The testing apparatus 100 collectively tests the optical characteristics, such as wavelengths, of the plurality of LEDs 10 on the basis of the intensity distributions of the wavelengths of the light emitted from the plurality of LEDs 10. The testing apparatus 100 according to the present embodiment further uses the photoelectric effect of the LED 10 to collectively test the luminance characteristics or the luminosity characteristics of the plurality of LEDs 10 on the basis of the photoelectric signal output from the LED 10 irradiated with light.

The testing apparatus 100 according to the present embodiment bidirectionally performs wavelength measurement and photoelectric signal measurement for the plurality of LEDs 10 by using the same optical system. When the testing apparatus 100 according to the present embodiment ends one of the wavelength measurement and the photoelectric signal measurement and starts the other, there is no need to change an apparatus configuration or move the LED 10 to be tested.

The testing apparatus 100 according to the present embodiment collectively tests the optical characteristics, such as wavelengths, and the luminance characteristics or the luminosity characteristics of the plurality of LEDs 10, for example, in a state where an LED group in which the plurality of LEDs 10 are formed on a wafer 15 which is an LED wafer is placed on the placement unit 160. Note that in the following description, the optical characteristics, such as wavelength, of the LED 10 may be simply referred to as wavelength characteristics.

The LED 10 in the present embodiment is a micro LED having a dimension of 100 μm or less. Note that instead of the micro LED, the LED 10 may be a mini LED having a dimension larger than 100 μm and equal to or less than 200 μm, an LED having a dimension larger than 200 μm, or may be another light emitting element such as an LD.

In addition, the plurality of LEDs 10 in the present embodiment are not electrically connected to each other on the wafer 15. The LED group is a back surface emission type in which the light emitting surfaces of the plurality of LEDs 10 face the wafer 15, and the wafer 15 transmits light. On each LED 10, two terminals 11 are formed apart from each other in a Y axis direction. Each terminal 11 of the plurality of LEDs 10 does not face the wafer 15. Note that, in the LED group of a back surface emission type as in the present embodiment, the plurality of LEDs 10 and the wafer 15 on which the plurality of LEDs 10 are mounted may be collectively referred to as a wafer. Note that the LED group may be a front surface emission type in which the light emitting surfaces of the plurality of LEDs 10 do not face the wafer 15, and in this case, the wafer 15 may not transmit light, and each terminal 11 of the plurality of LEDs 10 may not face the wafer 15 or may face the wafer 15. When each terminal 11 of the plurality of LEDs 10 faces the wafer 15, a via extending in a Z axis direction may be formed at the position of each terminal 11 in the wafer 15 so as to bring a power supply probe into contact with each terminal 11.

The plurality of LEDs 10 may be formed on a wafer provided with electrical wiring or on a glass-based panel (PLP) having a substantially rectangular outer shape, and may be electrically connected to each other to be unitized or cellularized.

The testing apparatus 100 includes a light measurement unit 110 and a control unit 120. The light measurement unit 110 receives the light emitted from the plurality of LEDs 10 to be tested by the testing apparatus 100, and measures the wavelengths of the received light. In other words, the light measurement unit 110 measures the wavelength of the combined light obtained by combining the light emitted from each of the plurality of LEDs 10. The light measurement unit 110 may measure the wavelengths of the light emitted by one or more LEDs 10 in the group for each group obtained by dividing all the LEDs 10 to be tested into several groups. In addition, the light measurement unit 110 may individually measure the wavelength of the light emitted from each of the plurality of LEDs 10 to be tested.

The light measurement unit 110 according to the present embodiment includes, for example, a wavelength meter, measures the wavelength of the light emitted from the LED 10 under the control of the control unit 120, and specifies the intensity distribution of the wavelength of the light. The light measurement unit 110 may specify a peak wavelength or a half-value width of the light on the basis of the intensity distribution, or may measure a main wavelength which is a wavelength corresponding to a color when the light is viewed with eyes. The light measurement unit 110 may be a spectrometer, an optical spectrum analyzer, or the like instead of the wavelength meter. The light measurement unit 110 outputs data indicating the specified intensity distribution to the control unit 120.

The control unit 120 controls each configuration of the testing apparatus 100. More specifically, the control unit 120 sequence-controls a plurality of configurations in the testing apparatus 100 by referring to a storage unit 180 that stores a sequence, a program, and the like for controlling each configuration in the testing apparatus 100.

For example, the control unit 120 functions as a light emission control unit 121 that causes the plurality of LEDs 10 to emit light by controlling the electrical connection unit 150 and an electrical measurement unit 155 to supply a current of a predetermined current value to the plurality of LEDs 10. The control unit 120 may cause the plurality of LEDs 10 to emit light by controlling the electrical connection unit 150 and the electrical measurement unit 155 to supply a voltage of a predetermined voltage value to the plurality of LEDs 10, and redundant description will be omitted below. In addition, the control unit 120 functions as a determination unit 123 that receives, from the light measurement unit 110, the wavelengths of the light, which is emitted from the plurality of LEDs 10, measured by the light measurement unit 110, and determines, on the basis of the intensity distributions of the wavelengths of the light, whether there is an abnormality in at least one LED 10 among the plurality of LEDs 10. In other words, the control unit 120 determines the presence or absence of abnormality of the plurality of LEDs 10 as a whole on the basis of the intensity distribution of the wavelength of the combined light measured by turning on all of the plurality of LEDs 10 to which the current is supplied.

The control unit 120 may refer to reference data for determining the presence or absence of abnormality of the plurality of LEDs 10 as a whole, reference data for determining the quality of each of the plurality of LEDs 10, determination results thereof, reference data for moving the electrical connection unit 150, and the like stored in the storage unit 180.

In addition, the testing apparatus 100 may further include a light source 130, an optical system 140, and the electrical measurement unit 155 in order to perform a photoelectric test of the plurality of LEDs 10. As illustrated in FIGS. 1 and 2, the light source 130 is connected to the optical system 140 common to the light measurement unit 110 and emits light toward the optical system 140. The light source 130 emits light in the reaction wavelength band of the plurality of LEDs 10 under the control of the control unit 120. The irradiation time, wavelength, intensity, and the like of the light to be emitted from the light source 130 are controlled by the control unit 120.

The light source 130 may be, for example, a light source that emits light in a wide wavelength band, such as a xenon light source, or may be a light source that emits light in a narrow wavelength band, such as a laser light source. The light source 130 may include a plurality of laser light sources having different wavelengths. Note that, when the reaction wavelength and the emission wavelength of the LED 10 are different from each other, even if the LED 10 is irradiated with light having the emission wavelength of the LED 10, photoelectric conversion is not appropriately performed due to the difference.

In the present embodiment, as illustrated in FIG. 2, the optical system 140 irradiates the plurality of LEDs 10 with the light emitted from the light source 130. More specifically, as illustrated in FIG. 2, the optical system 140 according to the present embodiment diffuses the light emitted from the light source 130 to collectively irradiate the plurality of LEDs 10 with the light emitted from the light source 130. That is, a projection surface, on the XY plane, of the light emitted from the light source 130 via the optical system 140 covers at least the plurality of LEDs 10 of the LED group.

In addition, as illustrated in FIG. 1, the optical system 140 according to the present embodiment condenses the diffused light emitted from the plurality of LEDs 10 to guide the light to the light measurement unit 110. In other words, the light measurement unit 110 according to the present embodiment receives the light emitted from the plurality of LEDs 10 via the optical system 140. With such a connection configuration of the optical system 140, the light source 130, and the light measurement unit 110, the testing apparatus 100 can perform the wavelength measurement and the photoelectric signal measurement for the plurality of LEDs 10 bidirectionally by using the common optical system 140.

In the present embodiment, as illustrated in FIG. 1, the optical system 140 guides the light emitted from the plurality of LEDs 10 to both the light measurement unit 110 and the light source 130, but instead, the optical system 140 may be configured to guide the light emitted from the plurality of LEDs 10 only to the light measurement unit 110 and not to the light source 130.

The optical system 140 according to the present embodiment includes a bifurcated fiber 141. The bifurcated fiber 141 is a Y-shaped optical fiber. The end portions of the bifurcated fiber 141 on the branched side are connected to the light source 130 and the light measurement unit 110.

The bifurcated fiber 141 is an example of a branched fiber, and a multi-branched fiber such as a three-branched fiber or a four-branched fiber may be used instead of the bifurcated fiber 141. In this case, the testing apparatus 100 may include two or more light sources 130, and one light source 130 may be connected to each end portion of the multi-branched fiber on the branch side. In this case, the optical system 140 may combine the light emitted from the plurality of light sources 130 which emit light in wavelength bands different from each other to irradiate the plurality of LEDs 10. When the light source 130 emits light of a specific wavelength band, the plurality of light sources 130 are connected to the optical system 140 in this manner, so that the wavelength bandwidth of the light with which the LED 10 is irradiated can be widened, and the LED 10 can be caused to perform photo-electric conversion more reliably.

In addition, the optical system 140 may further have a lens unit 143 including one or more lenses, and the lens unit 143 is arranged on an optical path in the optical system 140. In addition, as illustrated in FIG. 2, the lens unit 143 converges the diffused light emitted from the plurality of LEDs 10 and causes the light to enter the bifurcated fiber 141.

The electrical measurement unit 155 measures a photo-electric signal obtained by each of the plurality of LEDs 10 photoelectrically converting the light radiated by the optical system. More specifically, the electrical measurement unit 155 measures the current value of the current output from the plurality of LEDs 10 via the electrical connection unit 150 under the control of the control unit 120. The electrical measurement unit 155 outputs the current value measured for each LED 10 to the control unit 120. Note that, instead of the current value of the current output from the plurality of LEDs 10, the electrical measurement unit 155 may measure a voltage value corresponding to the current value. Note that, as described above, the electrical measurement unit 155 according to the present embodiment also supplies current to the plurality of LEDs 10 via the electrical connection unit 150 under the control of the control unit 120.

In addition, the testing apparatus 100 may further include the electrical connection unit 150, the placement unit 160, a shielding unit 170, and the storage unit 180. The electrical connection unit 150 is, for example, a probe card (probe substrate), and is electrically connected to the terminal 11 of each of the plurality of LEDs 10 to be tested. Note that, in the present specification, when the term "electrically connected" is defined, it is intended to be electrically connected by contact or electrically connected in a non-contact manner. The electrical connection unit 150 is electrically connected by being in contact with the terminal 11 of each of the plurality of LEDs 10, but may be electrically connected in a non-contact manner by, for example, electromagnetic induction or near field communication.

The electrical connection unit 150 includes a substrate 151 provided with an electrical circuit and a plurality of electrical wirings, and a plurality of probes 153 extending from the substrate 151 toward each of the plurality of LEDs 10 and contacting respective terminals 11 of the plurality of LEDs 10.

The electrical connection unit 150 moves two-dimensionally on the XY plane and moves up and down in the Z axis direction by being driven and controlled by the control unit 120. The electrical connection unit 150 is driven and controlled by the control unit 120 to be arranged such that the plurality of LEDs 10 are positioned between the light source 130 and the electrical connection unit 150. In this state, the plurality of probes 153 of the electrical connection unit 150 are in contact with respective terminals 11 of the plurality of LEDs 10 from the Z axis positive direction side of the wafer 15. The other end of each probe 153 opposite to the one end in contact with the terminal 11 is electrically connected to the electrical wiring provided on the substrate 151. The plurality of electrical wirings of the plurality of probes 153 extend from the side surface of the substrate 151 and are electrically connected to the electrical measurement unit 155.

The LED group is placed on the placement unit 160 on the Z axis positive direction side. The placement unit 160 in the illustrated example has a substantially circular outer shape in a plan view, but may have another outer shape. The placement unit 160 has a function of holding a vacuum chuck, an electrostatic chuck, and the like, and holds the wafer 15 of the placed LED group. The placement unit 160 has the through hole 161 at the center of the XY plane so as not to block the light emitted by the plurality of LEDs 10 and transmitted through the wafer 15, and holds the wafer 15 around the through hole 161.

The shielding unit 170 shields light other than the light emitted from the light source 130. The surface of the shielding unit 170 in the present embodiment is entirely painted black to prevent irregular reflection of light on the surface. In addition, as illustrated in FIG. 1, the shielding unit 170 is provided so as to form a sealed space by the lens unit 143, the placement unit 160, and the wafer 15, and this configuration shields light other than the light emitted from the light source 130.

The testing apparatus 100 may not include the electrical connection unit 150, the placement unit 160, and the shielding unit 170. Additionally or alternatively, the testing apparatus 100 may not include the light source 130, the optical system 140, and the electrical measurement unit 155.

Figure 3:
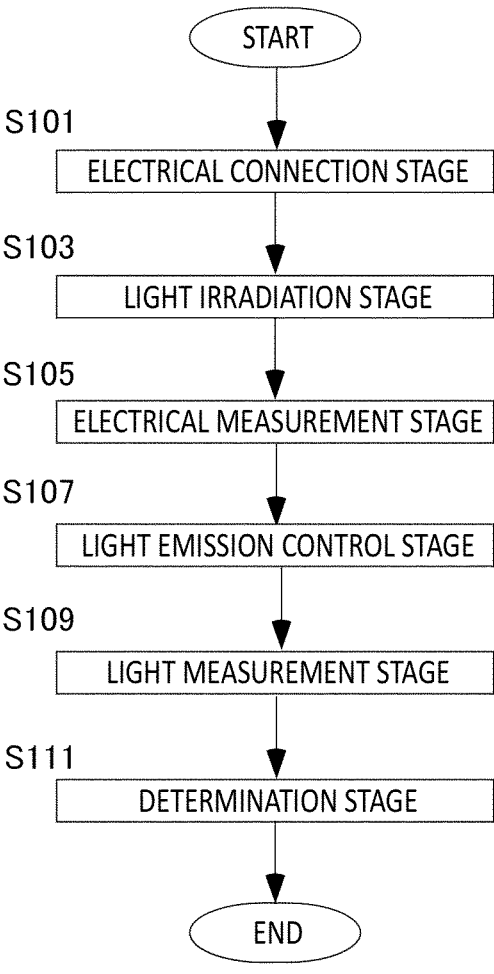
FIG. 3 is an example of a flow diagram for explaining a flow of a testing method by the testing apparatus 100.

FIG. 3 is an example of a flow diagram for explaining a flow of a testing method by the testing apparatus 100. The control unit 120 of the testing apparatus 100 according to the present embodiment performs a photoelectric test of the plurality of LEDs 10 by the electrical measurement unit 155 and a wavelength characteristic test of the plurality of LEDs 10 by the light measurement unit 110, and determines the quality of the plurality of LEDs 10 on the basis of the measurement result of at least one of the electrical measurement unit 155 or the light measurement unit 110.

The flow illustrated in FIG. 3 is started when, for example, a user performs, on the testing apparatus 100, an input to start a test of the LED group in a state where the LED group is placed on the placement unit 160.

The testing apparatus 100 performs an electrical connection stage of testing electrical characteristics of the plurality of LEDs 10 by supplying current from the electrical measurement unit 155 via the electrical connection unit 150 to the plurality of LEDs 10 to be tested (step S101).

As a specific example, the control unit 120 of the testing apparatus 100 drives and controls the electrical connection unit 150, and electrically connects the plurality of probes 153 of the electrical connection unit 150 to the respective terminals 11 of a plurality of LEDs 10 to be tested in the LED group on the placement unit 160. The control unit 120 supplies current or voltage from the electrical measurement unit 155 to the plurality of LEDs 10 via the electrical connection unit 150, performs an electrical characteristic test on the LEDs 10, and specifies the LED 10 of which measured voltage or current value is out of a threshold range as having poor electrical characteristics. The threshold is stored in the storage unit 180. The control unit 120 excludes the LED 10, which is determined to have poor electrical characteristics, from the target of the tests after the electrical characteristic test. Note that, in each step after step S101 in the flow, the control unit 120 executes each test in a state where the electrical connection unit 150 is electrically connected to the plurality of LEDs 10 in the LED group, and redundant description will be omitted.

Following the electrical characteristic test, the testing apparatus 100 uses the photoelectric effect of the LED 10 to collectively test the luminance characteristics or the luminosity characteristics of the plurality of LEDs 10 on the basis of the photoelectric signal output from the LED 10 irradiated with light. The testing apparatus 100 specifies an LED 10 having poor luminance or luminosity from the photoelectric signal measurement result, and excludes the LED 10 from the target of the subsequent test.

Specifically, first, the testing apparatus 100 executes a light irradiation stage in which the optical system 140 irradiates the plurality of LEDs 10 to be tested for photoelectric signal measurement with light emitted from the light source 130 (step S103).

As a specific example, the control unit 120 outputs a command to the light source 130 to emit light to the plurality of LEDs 10 via the optical system 140. The optical system 140 diffuses the light, which is emitted from the light source 130, entering from one end of the bifurcated fiber 141 by the lens unit 143 connected to the other end of the bifurcated fiber 141, thereby collectively irradiating the plurality of LEDs 10 with the light emitted from the light source 130.

The testing apparatus 100 executes an electrical measurement stage of measuring a photoelectric signal obtained by each of the plurality of LEDs 10 photoelectrically converting the light radiated by the optical system (step S105). As a specific example, the control unit 120 issues a command to the electrical measurement unit 155 and causes the electrical measurement unit to collectively measure the photoelectric signal output from each of the plurality of LEDs 10 via the electrical connection unit 150, that is, the current value of the current and to output each measurement result to the control unit 120.

The control unit 120 determines the quality of each of the plurality of LEDs 10 on the basis of the photoelectric signals, which are output from the plurality of LEDs 10, measured by the electrical measurement unit 155, and excludes the LED 10, which is determined to be defective, from the target to be caused to emit light in the test after the test of the luminance characteristics or the luminosity characteristics. The control unit 120 may refer to the data indicating a normal range of the current value of the photoelectric signal stored in advance in the storage unit 180 to determine that an LED 10 in which the measured photoelectric signal is out of the normal range is defective, and exclude the LED 10 from the target of the subsequent test. As an example of the normal range, a range based on a statistic corresponding to the photoelectric signal output from each of the plurality of LEDs 10 may be used. More specifically, as an example of the normal range, a range within an average current value±1 σ, a range within the average current value±2σ, or a range within the average current value±3σ may be used, the average current value being an average current value of the current output from each of the plurality of LEDs 10. In this case, the control unit 120 may calculate the average current value and a standard deviation a on the basis of the current value of the current, which is output from each of the plurality of LEDs 10, stored in the storage unit 180.

The magnitude of the photoelectric signal output by the photoelectric effect of the LED 10 is correlated with the luminance characteristics and the luminosity characteristics of the LED 10. In this regard, in addition to or instead of determining the quality of the LED 10 with reference to the data indicating the normal range of the current value of the photoelectric signal, the control unit 120 may calculate the luminance from the measured photoelectric signal by referring to the data, which is stored in advance in the storage unit 180, indicating the correlation between the photoelectric signal output from the LED 10 and the luminance of the light emitted from the LED 10. Similarly to the method of calculating the luminance, the control unit 120 may calculate the luminosity instead of or in addition to the luminance.

The control unit 120 may further determine the quality of the LED 10 on the basis of the calculated luminance and/or luminosity. For example, the control unit 120 may determine the quality of LED 10 by referring to the data indicating a normal range of the luminance and/or luminosity stored in the storage unit 180 in advance. Note that the correlation described above may be calculated in advance by the testing apparatus 100 or may be calculated by an external apparatus. When the correlation is calculated by an external apparatus, the testing apparatus 100 may acquire the data indicating the correlation from the external apparatus.

In a plurality of following steps, the testing apparatus 100 collectively tests the wavelength characteristics of the plurality of LEDs 10 on the basis of the intensity distributions of the wavelengths of the light emitted from the plurality of LEDs 10. By using the intensity distribution of the wavelength of the combined light emitted from the plurality of LEDs 10 remaining without being excluded in the photoelectric test described above, the testing apparatus 100 determines whether the LED 10 having an abnormal wavelength is included in the plurality of LEDs 10.

As described above, the testing apparatus 100 performs the wavelength measurement for the plurality of LEDs 10 by using the optical system 140 common to the photoelectric signal measurement. In addition, when starting the wavelength measurement after ending the photoelectric signal measurement, the testing apparatus 100 does not need to change the apparatus configuration and move the LED 10 to be tested.

Specifically, first, the testing apparatus 100 executes a light emission control stage in which the plurality of LEDs 10 are caused to emit light (step S107). As a specific example, the control unit 120 issues a command to the electrical measurement unit 155 to supply current having a predetermined current value via the electrical connection unit 150 to some or all of the plurality of LEDs 10 to be tested for wavelength characteristics, thereby causing the plurality of LEDs 10, to which the current has been supplied, to collectively emit light.

When causing some LEDs 10 of the plurality of LEDs 10 to be tested for wavelength characteristics to collectively emit light, also for the remaining LEDs 10 among the plurality of LEDs 10 to be tested for wavelength characteristics, the control unit 120 repeats causing some or all of the LEDs 10 to emit light collectively, thereby causing all of the LEDs 10 to be tested for wavelength characteristics to emit light sequentially in stages. Note that, in the present specification, in the test of the wavelength characteristics, the plurality of LEDs 10 caused to collectively emit light in this manner may be referred to as a plurality of LEDs 10 included in the measurement target area of the LED group. In this case, one or more measurement target areas each including the plurality of LEDs 10 exist in the LED group.

The testing apparatus 100 receives the light emitted from the plurality of LEDs 10 caused to emit light in the light emission control stage, and executes a light measurement stage of measuring the wavelengths of the received light (step S109). As a specific example, the control unit 120 issues a command to the light measurement unit 110 and causes the light measurement unit to receive the light, which is condensed by the optical system 140 and emitted from each of a plurality of LEDs 10 included in the measurement target area of the LED group, to measure the wavelength of the combined light of the plurality of LEDs 10, and to output the measurement result to the control unit 120. Note that, when a plurality of measurement target areas exist in the LED group, the control unit 120 causes the light measurement unit 110 to output the measurement results of the respective measurement target areas to the control unit 120.

The testing apparatus 100 executes a determination stage of determining, on the basis of the intensity distributions of the wavelengths of the light, which is emitted from the plurality of LEDs 10, measured in the light measurement stage, whether there is an abnormality in at least one LED 10 among the plurality of LEDs 10 (step S111), and the flow ends.

As a specific example, the control unit 120 determines whether there is an abnormality in at least one LED 10 among the plurality of LEDs 10 included in the measurement target area on the basis of the intensity distribution of the wavelength of the light indicated by the measurement result, which is input from the light measurement unit 110, for each measurement target area. More specifically, the control unit 120 determines whether there is an abnormality in at least one LED 10 among the plurality of LEDs 10 on the basis of a result of comparing the intensity distributions of the wavelengths of the light emitted from the plurality of LEDs 10 included in the measurement target area with a reference intensity distribution corresponding to the number of the LEDs 10.

In response to determination, as a result of executing the flow of FIG. 3, that there is an abnormality in the plurality of LEDs 10 included in the measurement target area, the control unit 120 may issue a command to the electrical measurement unit 155 and the light measurement unit 110 to execute each stage of steps S107 to S111 sequentially on each of the plurality of LEDs 10, thereby individually executing the wavelength characteristic test. However, in the determination stage of step S111 in this case, the control unit 120 determines, on the basis of the intensity distribution of the wavelength of the light emitted from one LED 10 measured in the light measurement stage, whether there is an abnormality in the LED 10. For example, the control unit 120 determines whether there is an abnormality in the LED 10 on the basis of a result of comparing the intensity distribution with a reference intensity distribution in the case of one LED 10.

Alternatively, the control unit 120 may have a function of dividing the plurality of LEDs 10 into a plurality of groups in response to determination, as a result of executing the flow of FIG. 3, that there is an abnormality in the plurality of LEDs 10 included in the measurement target area. In this case, the control unit 120 and the light measurement unit 110 may cause all the LEDs 10 of each of the plurality of groups to emit light and measure the wavelengths of light. The control unit 120 may further determine whether there is an abnormality in at least one LED 10 included in each of the plurality of groups on the basis of the intensity distributions of the wavelengths of the light emitted from all the LEDs 10 included in each of the plurality of groups. For example, the control unit 120 may gradually narrow down the defective LEDs 10 by a two-branch method. Note that the control unit 120 in this case is an example of a group division unit.

In the testing apparatus 100, the order of steps in the flow of FIG. 3 may be different, and one or more steps may be omitted. For example, after executing the electrical characteristic test in step S101, the testing apparatus 100 may execute the wavelength characteristic test in steps S107 to S111, and subsequently execute the luminance or luminosity characteristic test in steps S103 to 5105. In addition, for example, the testing apparatus 100 may execute the wavelength characteristic test in steps S107 to S111 without executing the electrical characteristic test in step S101 and the luminance or luminosity characteristic test in steps S103 to S105. In addition, for example, the testing apparatus 100 may execute the luminance or luminosity characteristic test in steps S103 to S105 and the wavelength characteristic test in steps S107 to S111 in any order without executing the electrical characteristic test in step S101.

Figure 4:
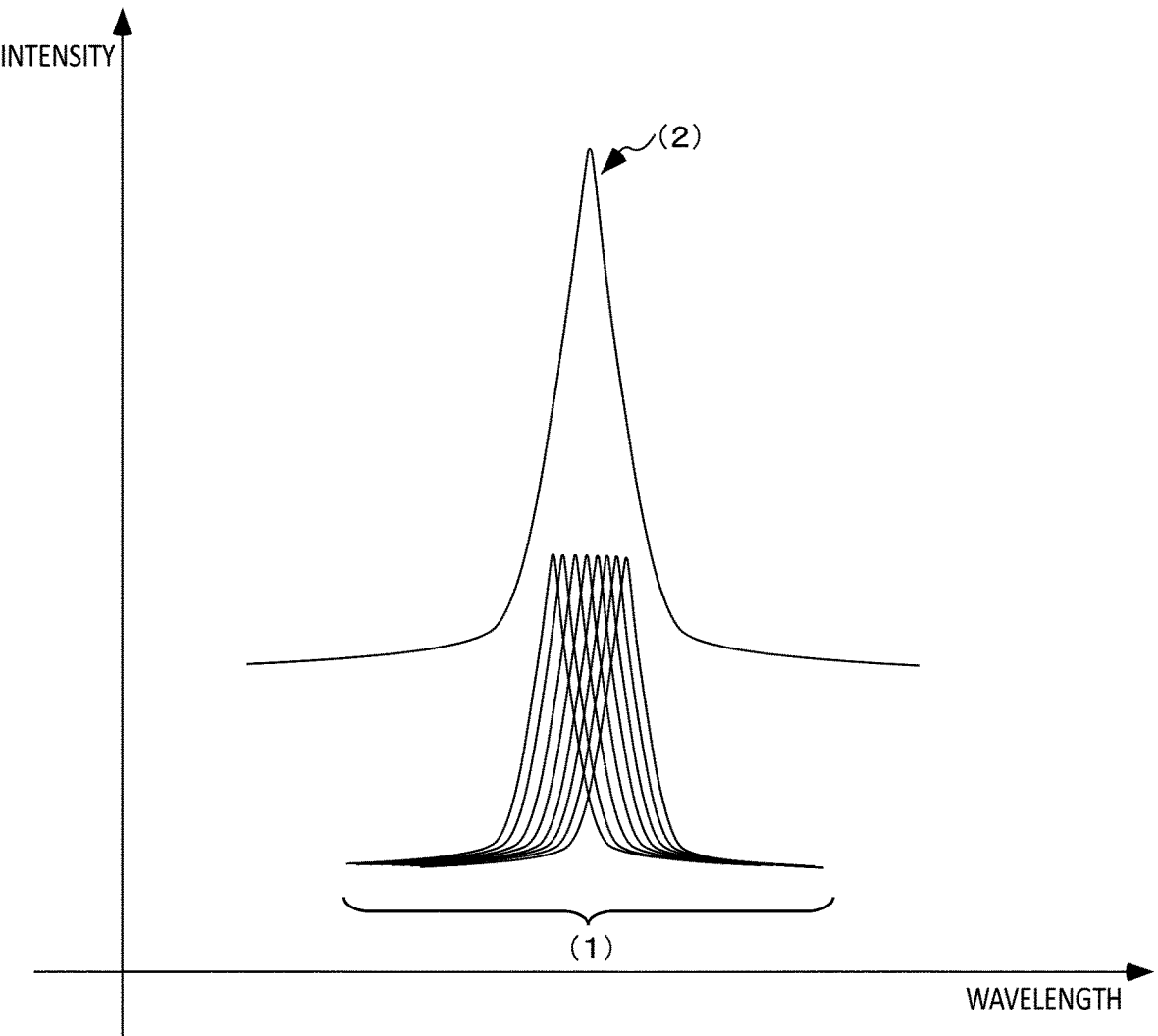
FIG. 4 is an example of a graph showing intensity distributions of wavelengths of light emitted from the plurality of LEDs 10 included in a measurement target area.

FIG. 4 is an example of a graph showing the intensity distributions of wavelengths of the light emitted from the plurality of LEDs 10 included in the measurement target area. In the graph of FIG. 4, a horizontal axis represents the wavelength of light, and the vertical axis represents the intensity of light. On the graph of FIG. 4, the intensity distribution of each wavelength of the light emitted from the plurality of LEDs 10 included in the measurement target area is indicated by (1), and the intensity distribution of the combined wavelength is indicated by (2). The same applies to the following drawings, and redundant description will be omitted.

The intensity of the light emitted from the LED 10 has a correlation with the luminance and luminosity of the light emitted from the LED 10, and has a correlation with the current value of the photoelectric signal obtained by the LED 10 photoelectrically converting the light radiated by the optical system. In the example of FIG. 4, all of the plurality of LEDs 10 included in the measurement target area emit light with the intensity same as each other at the wavelength originally expected as the wavelength of the emission light of the LED 10. That is, in the example of FIG. 4, in the plurality of LEDs 10, the wavelength is not abnormal, and the current values of the photoelectric signals obtained by photoelectrically converting the light collectively radiated from the same light source 130 are equal to each other.

As described above, the intensity distribution of the wavelength of the combined light emitted from the plurality of LEDs 10 in which the current values of the photoelectric signals are equal to each other and the wavelength is not abnormal is as the intensity distribution (2) of the combined wavelength illustrated in FIG. 4. For example, the testing apparatus 100 sets the intensity distribution (2) of the combined wavelength illustrated in FIG. 4 as one of the reference intensity distributions described above. The testing apparatus 100 may store the data indicating the reference intensity distribution in advance in the storage unit 180 for each of the numbers of the LEDs 10 of which the intensity distributions of the wavelengths is combined, and refer to the data in step S111 in the flow of FIG. 3. For example, when the intensity distribution of the wavelength of the combined light measured for each measurement target area matches the reference intensity distribution corresponding to the number of the plurality of LEDs 10 included in the measurement target area, the testing apparatus 100 may determine that there is no abnormality in any of the plurality of LEDs 10 included in the measurement target area.

Figure 5:
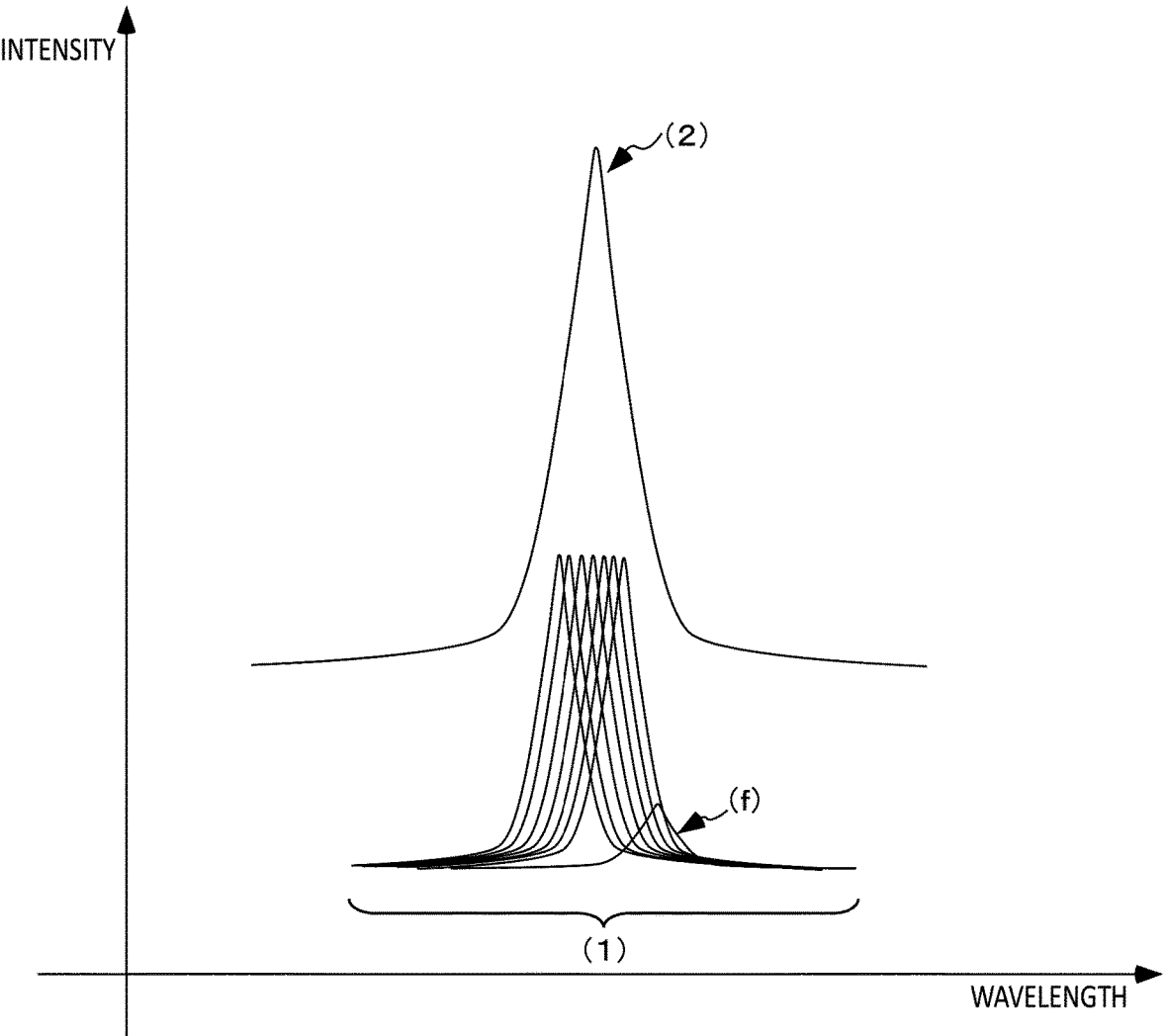
FIG. 5 is an example of a graph showing intensity distributions of wavelengths of light emitted from the plurality of LEDs 10 included in the measurement target area.

FIG. 5 is an example of a graph showing the intensity distributions of wavelengths of the light emitted from the plurality of LEDs 10 included in the measurement target area. In the example of FIG. 5, as indicated by an intensity distribution (f), one of the plurality of LEDs 10 emits light with a weaker intensity than those of the other LEDs 10 at a wavelength deviated from the wavelength originally expected as the wavelength of light emitted from the LED 10. That is, in the example of FIG. 5, in the one of the plurality of LEDs 10, there is an abnormality in wavelength, and the current value of the photoelectric signal obtained by photoelectrically converting the light collectively radiated from the same light source 130 is lower compared with those of the remaining LEDs 10. Nevertheless, the intensity distribution (2) of the combined wavelength illustrated in FIG. 5 is similar to the intensity distribution (2) of the combined wavelength illustrated in FIG. 4.

As in the example of FIG. 5, even when the LED 10 having an abnormality in wavelength is included in the plurality of LEDs 10, in a case where the current value of the photoelectric signal output from the LED 10 is lower than those of the other LEDs 10, the intensity distribution of the wavelength of the combined light emitted from the plurality of LEDs 10 may matches the reference intensity distribution corresponding to the number of the plurality of LEDs 10. In this case, it may be difficult to detect the abnormality of the wavelength of the LED 10.

Figure 6:
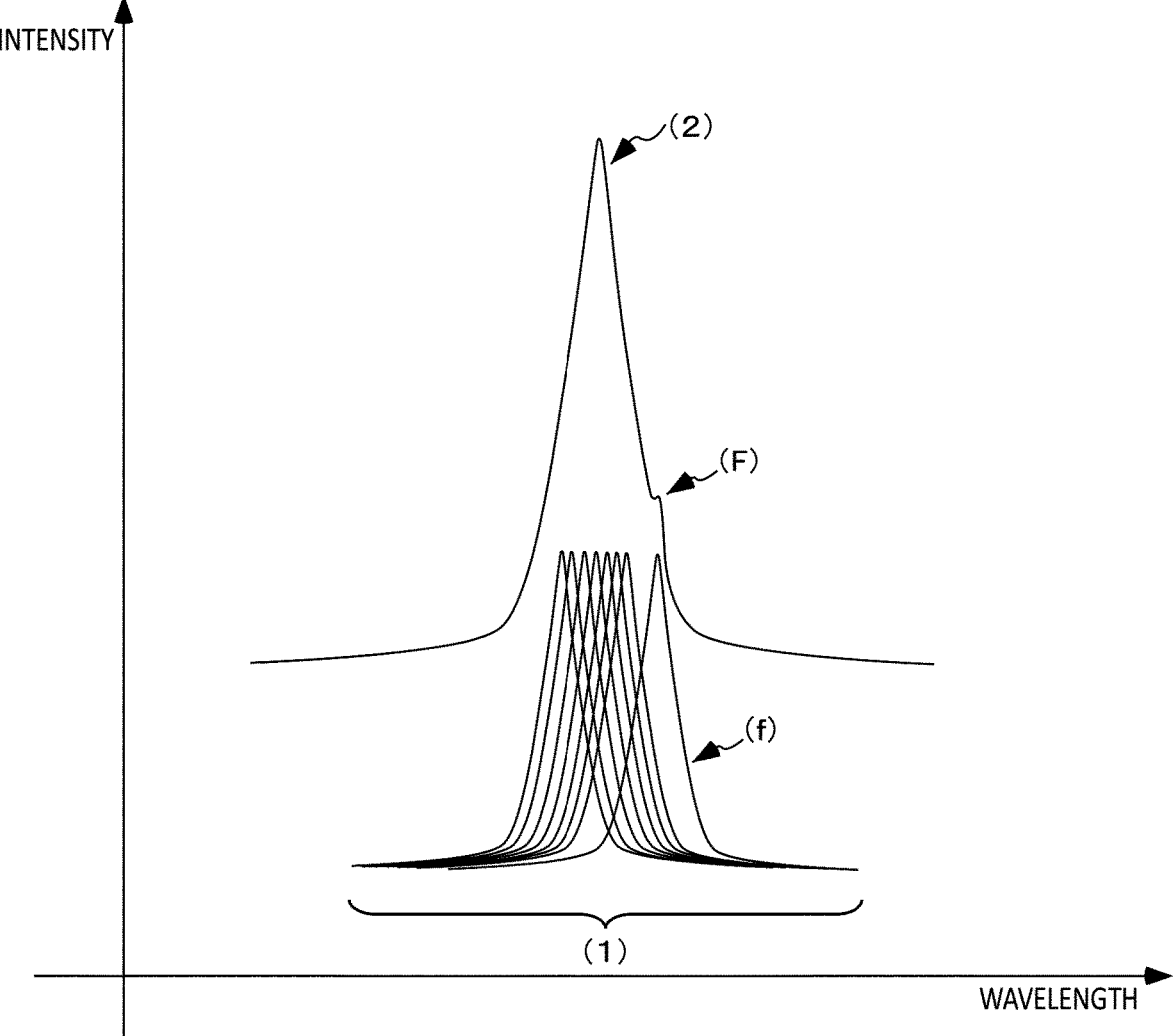
FIG. 6 is an example of a graph showing intensity distributions of wavelengths of light emitted from the plurality of LEDs 10 included in the measurement target area.

FIG. 6 is an example of a graph showing the intensity distributions of wavelengths of the light emitted from the plurality of LEDs 10 included in the measurement target area. In the example of FIG. 6, as indicated by an intensity distribution (f), one of the plurality of LEDs 10 emits light with the intensity equal to those of the other LEDs 10 at a wavelength deviated from the wavelength originally expected as the wavelength of light emitted from the LED 10. That is, in the example of FIG. 6, in the one of the plurality of LEDs 10, compared to the remaining LEDs 10, there is an abnormality in wavelength, and on the other hand, the current value of the photoelectric signal obtained by photoelectrically converting the light collectively radiated from the same light source 130 is equal to those of the remaining LEDs 10. As a result, the intensity distribution (2) of the combined wavelength illustrated in FIG. 6 is different from the intensity distribution (2) of the combined wavelength illustrated in FIG. 4, and is varied at the position indicated by (F).

As described in step S105 in the flow of FIG. 3, the testing apparatus 100 may determine the quality of each of the plurality of LEDs 10 on the basis of the photoelectric signals output from the plurality of LEDs 10 to be tested, and exclude the LED 10, which is determined to be defective, from the target to be caused to emit light in the test after the test of the luminance characteristics or the luminosity characteristics. As an example, the testing apparatus 100 may exclude the LED 10 in which the current value of the photoelectric signal obtained by collectively irradiating the plurality of LEDs 10 to be tested with light from the same light source 130 and performing photoelectric conversion is relatively low among the plurality of LEDs 10.

As a result, when the LED 10 having normal light intensity and an abnormal light wavelength is included in the plurality of LEDs 10 included in the measurement target area, the testing apparatus 100 generates the intensity distribution (2) of the wavelength of the combined light which is varied from the reference intensity distribution as illustrated in FIG. 6. Therefore, the testing apparatus 100 can avoid a situation, in which it becomes difficult to detect the abnormality of the wavelength of the LED 10 as in the example of FIG. 5, in advance. That is, by combining the photoelectric test and the wavelength characteristic test, the testing apparatus 100 can correctly determine that the LED 10 having poor luminance or luminosity is included in the plurality of LEDs 10 to be tested and that the LED 10 having an abnormality in wavelength is included. It can also be said that the testing apparatus 100 can improve the test accuracy of the wavelength characteristic test as compared with a case where the LED 10 having an abnormality in the photoelectric signal or the like is not excluded from the target of the wavelength characteristic test.

In addition, when the testing apparatus 100 generates the intensity distribution of the wavelength of the combined light as illustrated in FIG. 6 and confirms the presence of the above-described variation as a result of comparing the generated intensity distribution with the reference intensity distribution, the wavelength component for each frequency may be calculated by using a method such as Fourier transform or GMM, for example. As a result, the testing apparatus 100 can more reliably confirm whether a wavelength component which is not to exist is included in the wavelength component of each of the plurality of LEDs 10 included in the measurement target area, and thus, can more reliably confirm whether a defective LED 10 which emits light of the wavelength component is included in the plurality of LEDs 10. In other words, the testing apparatus 100 can confirm that the variation in the intensity distribution of the wavelength of the combined light is not caused by a measurement error, disturbance, or the like, but caused by the presence of the LED 10 which emits light having a wavelength deviated from the wavelength originally expected as the wavelength of the emission light of the LED 10.

As described above, according to the testing apparatus 100 of the present embodiment, the plurality of LEDs 10 to be tested are caused to collectively emit light, the wavelengths of the light emitted from the plurality of LEDs 10 are comprehensively measured, and whether there is an abnormality in at least one LED 10 among the plurality of LEDs 10 is determined on the basis of the comprehensive intensity distribution of the wavelengths. As a result, the testing apparatus 100 can shorten the execution time of the test as compared with a case where the plurality of LEDs 10 to be tested are caused to individually and sequentially emit light to test the wavelength characteristics.

In addition, according to the testing apparatus 100 of the present embodiment, the wavelength characteristic test and the luminance characteristic test or the luminosity characteristic test of the plurality of LEDs 10 are bidirectionally performed by using the same optical system. More specifically, the testing apparatus 100 comprehensively receives the light emitted from the plurality of LEDs 10 via the optical system 140, and collectively irradiates the plurality of LEDs 10 with light emitted from the light source 130. The testing apparatus 100 comprehensively tests wavelength characteristics of the plurality of LEDs 10 by using the light emitted from the plurality of LEDs 10, and individually tests the luminance characteristics or luminosity characteristics of the plurality of LEDs 10 by using the photoelectric signal obtained by each of the plurality of LEDs 10 photoelectrically converting the light radiated by the optical system.

As described above, according to the testing apparatus 100, without any need to change the apparatus configuration and move the LEDs 10 to be tested, the wavelength characteristics of the plurality of LEDs 10 to be tested can be tested comprehensively, and the luminance characteristics or the luminosity characteristics of the plurality of LEDs 10 to be tested can be tested individually by using the same optical system. As a result, as compared with a case where it is needed to change the apparatus configuration or move the LED 10 to be tested when switching these tests, the testing apparatus 100 can not only shorten the execution time of the test but also prevent a measurement error due to an environmental difference in the case of using different optical systems in each test.

In the plurality of embodiments described above, instead of the branched fiber such as the bifurcated fiber 141, the testing apparatus 100 may include another mechanism such as a prism in the optical system 140. In this case, the prism or the like has a functional configuration similar to the functional configuration of the bifurcated fiber 141 described in the above embodiment.

In the plurality of embodiments described above, when the LED group has a configuration in which the plurality of LEDs are formed on a glass-based panel (PLP) having a substantially rectangular outer shape on which electrical wirings are formed, the electrical connection unit may have a configuration in which the probe is brought into contact with each wiring in a row direction and a column direction arranged on two side surfaces of the panel.

Various embodiments of the present invention may be described with reference to flowcharts and block diagrams whose blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits, and may include integrated circuits (IC) and/or discrete circuits. The programmable circuit may include a reconfigurable hardware circuit including logical AND, logical OR, logical XOR, logical NAND, logical NOR, and other logical operations, a memory element such as a flip-flop, a register, a field programmable gate array (FPGA) and a programmable logic array (PLA), and the like.

A computer-readable medium may include any tangible device that can store instructions to be executed by a suitable device, and as a result, the computer-readable medium having instructions stored thereon includes an article of manufacture including instructions which can be executed to create means for performing operations specified in the flowcharts or block diagrams. Examples of the computer-readable medium may include an electronic storage medium, a magnetic storage medium, an optical storage medium, an electromagnetic storage medium, a semiconductor storage medium, and the like. More specific examples of the computer-readable medium may include a floppy (registered trademark) disk, a diskette, a hard disk, a random access memory (RAM), a read-only memory (ROM), an erasable programmable read-only memory (EPROM or flash memory), an electrically erasable programmable read-only memory (EEPROM), a static random access memory (SRAM), a compact disc read-only memory (CD-ROM), a digital versatile disk (DVD), a Blu-ray (registered trademark) disk, a memory stick, an integrated circuit card, and the like.

The computer-readable instruction may include: an assembler instruction, an instruction-set-architecture (ISA) instruction; a machine instruction; a machine dependent instruction; a microcode; a firmware instruction; state-setting data; or either a source code or an object code written in any combination of one or more programming languages, including an object oriented programming language such as Smalltalk (registered trademark), JAVA (registered trademark), C++, or the like; and a conventional procedural programming language such as a "C" programming language or a similar programming language.

Computer-readable instructions may be provided to a processor of a general-purpose computer, special purpose computer, or other programmable data processing apparatuses, or to programmable circuitry, locally or via a local area network (LAN), wide area network (WAN) such as the Internet, or the like, to execute the computer-readable instructions to create means for performing operations specified in the flowcharts or block diagrams. An example of the processor includes a computer processor, processing unit, microprocessor, digital signal processor, controller, microcontroller, or the like.

Figure 7:
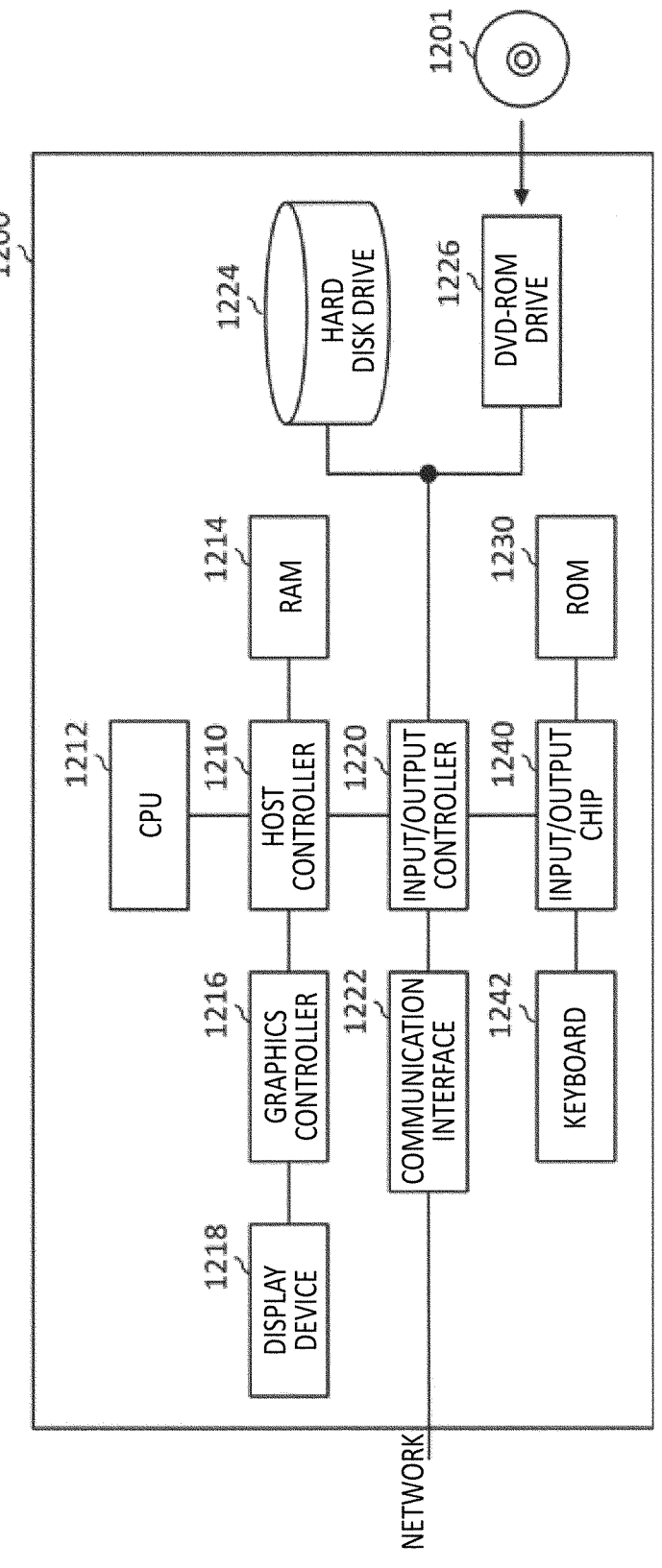
FIG. 7 illustrates an example of a computer 1200 in which a plurality of aspects of the present invention may be embodied in whole or in part.

FIG. 7 illustrates an example of a computer 1200 in which a plurality of aspects of the present invention may be embodied in whole or in part. A program installed on the computer 1200 can cause the computer 1200 to function as an operation associated with an apparatus according to embodiments of the present invention or as one or more "unit(s)" of the apparatus, or to perform the operation or the one or more "unit(s)", and/or can cause the computer 1200 to perform processes according to embodiments of the present invention or steps of the processes. Such a program may be executed by a CPU 1212 to cause the computer 1200 to perform particular operations associated with some or all blocks in the flowcharts or block diagrams described herein.

The computer 1200 according to the present embodiment includes a CPU 1212, a RAM 1214, a graphics controller 1216 and a display device 1218, which are connected to each other by a host controller 1210. The computer 1200 also includes input/output units such as a communication interface 1222, a hard disk drive 1224, a DVD-ROM drive 1226 and an IC card drive, which are connected to the host controller 1210 via an input/output controller 1220. The computer also includes legacy input/output units such as a ROM 1230 and a keyboard 1242, which are connected to the input/output controller 1220 via an input/output chip 1240.

The CPU 1212 operates in accordance with programs stored in the ROM 1230 and the RAM 1214, and controls each unit accordingly. The graphics controller 1216 acquires image data generated by the CPU 1212 on a frame buffer or the like provided in the RAM 1214 or in the graphics controller 1216 itself, and displays the image data on the display device 1218.

The communication interface 1222 communicates with other electronic devices via a network. The hard disk drive 1224 stores programs and data to be used by the CPU 1212 in the computer 1200. The DVD-ROM drive 1226 reads programs or data from the DVD-ROM 1201, and provides the programs or data to the hard disk drive 1224 via the RAM 1214. The IC card drive reads programs and data from an IC card and/or writes programs and data into the IC card.

The ROM 1230 has stored therein a boot program or the like to be executed by the computer 1200 at the time of activation, and/or a program that depends on the hardware of the computer 1200. The input/output chip 1240 may also connect various input/output units to the input/output controller 1220 via a parallel port, a serial port, a keyboard port, a mouse port or the like.

Programs are provided by a computer-readable storage medium such as the DVD-ROM 1201 or an IC card. The programs are read from the computer-readable storage medium, installed on the hard disk drive 1224, the RAM 1214 or the ROM 1230, which are also examples of a computer-readable storage medium, and executed by the CPU 1212. Information processing written in these programs is read by the computer 1200, and provides cooperation between the programs and the various types of hardware resources described above. An apparatus or method may be constituted by realizing the operation or processing of information in accordance with the usage of the computer 1200.

For example, if a communication is performed between the computer 1200 and external devices, the CPU 1212 may execute a communication program loaded on the RAM 1214, and instruct the communication interface 1222 to perform communication processing based on the processing described in the communication program. Under the control of the CPU 1212, the communication interface 1222 reads transmission data stored in a transmission buffer region provided in a recording medium such as the RAM 1214, the hard disk drive 1224, the DVD-ROM 1201 or an IC card, and sends the read transmission data to the network, or writes reception data received from the network into a reception buffer region or the like provided in the recording medium.

The CPU 1212 may also make all or required portions of the files or databases stored in an external recording medium such as the hard disk drive 1224, the DVD-ROM drive 1226 (DVD-ROM 1201) or an IC card to be read by the RAM 1214, and perform various types of processing on the data on the RAM 1214. Then, the CPU 1212 may write the processed data back in the external recording medium.

Various types of information such as various types of programs, data, tables and databases may be stored in the recording medium for information processing. The CPU 1212 may execute, on the data read from the RAM 1214, various types of processing including various types of operations, information processing, conditional judgement, conditional branching, unconditional branching, information retrieval/replacement, or the like described throughout the present disclosure and specified by instruction sequences of the programs, to write the results back to the RAM 1214. In addition, the CPU 1212 may retrieve information in a file, a database, or the like in the recording medium. For example, when a plurality of entries, each having an attribute value of a first attribute associated with an attribute value of a second attribute, are stored in the recording medium, the CPU 1212 may search the plurality of entries for an entry whose attribute value of the first attribute matches a designated condition, read the attribute value of the second attribute stored in the entry, and thereby acquire the attribute value of the second attribute associated with the first attribute that meets a predetermined condition.

The programs or software modules in the above description may be stored on the computer 1200 or a computer-readable storage medium near the computer 1200. Further, a recording medium such as a hard disk or a RAM provided in a server system connected to a dedicated communication network or the Internet can be used as a computer-readable storage media, which provides programs to the computer 1200 via the network.

While the present invention has been described with the embodiments, the technical scope of the present invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the present invention.

Note that the operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the operation flow is described by using phrases such as "first" or "next" in the scope of the claims, specification, or drawings, it does not necessarily mean that the process must be performed in this order.

EXPLANATION OF REFERENCES

10: LED;
11: terminal;
15: wafer;
100: testing apparatus;
110: light measurement unit;
120: control unit;
130: light source;
140: optical system;
150: electrical connection unit;
151: substrate;
153: probe;
155: electrical measurement unit;
160: placement unit;
170: shielding unit;
180: storage unit;
1200: computer;
1201: DVD-ROM;
1210: host controller;
1212: CPU;
1214: RAM;
1216: graphics controller;
1218: display device;
1220: input/output controller;
1222: communication interface;
1224: hard disk drive;
1226: DVD-ROM drive;
1230: ROM;
1240: input/output chip; and
1242: keyboard.

What is claimed is:
1. A testing apparatus comprising:
at least one processor;
a light emission control unit which uses the at least one processor to cause a plurality of light emitting elements to be tested to emit light;
a light measurement unit which uses the at least one processor to receive the light emitted from the plurality of light emitting elements and measures wavelengths of the received light;
a determination unit which uses the at least one processor to determine whether there is an abnormality in at least one light emitting element among the plurality of light emitting elements on a basis of intensity distributions of the wavelengths of the light, which is emitted from the plurality of light emitting elements, measured by the light measurement unit;
a light source;
an optical system which irradiates the plurality of light emitting elements with light emitted from the light source; and

an electrical measurement unit which measures a photo-electric signal obtained by each of the plurality of light emitting elements photoelectrically converting the light radiated by the optical system, wherein the light measurement unit receives the light emitted from the plurality of light emitting elements via the optical system;

wherein the optical system has a branched fiber having end portions on a branched side connected to the light source and the light measurement unit, and a lens unit including one or more lenses.

2. The testing apparatus according to claim 1, wherein the determination unit uses the at least one processor to:

determine quality of each of the plurality of light emitting elements on a basis of the photoelectric signals, which are output from the plurality of light emitting elements, measured by the electrical measurement unit, and exclude a light emitting element determined to be defective from a target to be caused to emit light by the light emission control unit.

3. The testing apparatus according to claim 1, wherein the optical system diffuses light emitted from the light source to collectively irradiate the plurality of light emitting elements with the light emitted from the light source, and condenses the diffused light emitted from the plurality of light emitting elements to guide the light to the light measurement unit.

4. The testing apparatus according to claim 2, wherein the optical system diffuses light emitted from the light source to collectively irradiate the plurality of light emitting elements with the light emitted from the light source, and condenses the diffused light emitted from the plurality of light emitting elements to guide the light to the light measurement unit.

5. The testing apparatus according to claim 4, wherein the optical system has a branched fiber having end portions on a branched side connected to the light source and the light measurement unit, and a lens unit including one or more lenses.

6. The testing apparatus according to claim 1, wherein the optical system combines light emitted from a plurality of light sources, each light source being identical to the light source, which emit light in wavelength bands different from each other to irradiate the plurality of light emitting elements.

7. The testing apparatus according to claim 2, wherein the optical system combines light emitted from a plurality of light sources, each light source being identical to the light source, which emit light in wavelength bands different from each other to irradiate the plurality of light emitting elements.

8. The testing apparatus according to claim 3, wherein the optical system combines light emitted from a plurality of light sources, each light source being identical to the light source, which emit light in wavelength bands different from each other to irradiate the plurality of light emitting elements.

9. The testing apparatus according to claim 1, wherein the determination unit uses the at least one processor to determine whether there is the abnormality on a basis of a result of comparing the intensity distributions with a reference intensity distribution corresponding to the number of the light emitting elements.

10. The testing apparatus according to claim 1, further comprising a group division unit which divides the plurality of light emitting elements into a plurality of groups in response to determination that there is the abnormality, wherein the light emission control unit and the light measurement unit use the at least one processor to cause all light emitting elements of each of the plurality of groups to emit light, and measure wavelengths of the light, and the determination unit uses the at least one processor to determine whether there is an abnormality in at least one light emitting element included in each of the plurality of groups on a basis of intensity distributions of the wavelengths of the light emitted from all the light emitting elements included in each of the plurality of groups.

11. A testing apparatus comprising:

a light source;

an optical system which irradiates a plurality of light emitting elements to be tested with light emitted from the light source;

an electrical measurement unit which measures a photo-electric signal obtained by each of the plurality of light emitting elements photoelectrically converting the light radiated by the optical system;

at least one processor;

a light emission control unit which uses the at least one processor to cause the plurality of light emitting elements to emit light;

a light measurement unit which uses the at least one processor to receive the light emitted from the plurality of light emitting elements via the optical system and measures wavelengths of the received light; and a determination unit which uses the at least one processor to determine quality of the plurality of light emitting elements on a basis of a measurement result of at least one of the electrical measurement unit and the light measurement unit;

wherein the optical system has a branched fiber having end portions on a branched side connected to the light source and the light measurement unit, and a lens unit including one or more lenses.

12. The testing apparatus according to claim 11, wherein the determination unit uses the at least one processor to determine quality of each of the plurality of light emitting elements on a basis of the photoelectric signals, which are output from the plurality of light emitting elements, measured by the electrical measurement unit, and exclude a light emitting element determined to be defective from a target to be caused to emit light by the light emission control unit.

13. The testing apparatus according to claim 11, wherein the optical system diffuses light emitted from the light source to collectively irradiate the plurality of light emitting elements with the light emitted from the light source, and condenses the diffused light emitted from the plurality of light emitting elements to guide the light to the light measurement unit.

14. A testing method comprising:

causing a plurality of light emitting elements to be tested to emit light;

receiving the light emitted from the plurality of light emitting elements and measuring wavelengths of the received light;

determining whether there is an abnormality in at least one light emitting element among the plurality of light emitting elements on a basis of intensity distributions of the wavelengths of the light, which is emitted from the plurality of light emitting elements, measured by measuring the wavelengths of the light;

irradiating, by an optical system, a plurality of light emitting elements to be tested with light emitted from a light source;

measuring a photoelectric signal obtained by each of the plurality of light emitting elements photoelectrically converting the light radiated by the optical system;

causing the plurality of light emitting elements to emit light;

receiving the light emitted from the plurality of light emitting elements via the optical system and measuring wavelengths of the received light; and determining quality of the plurality of light emitting elements on a basis of a measurement result of at least one of the measuring the photoelectric signal and the measuring the wavelengths of the light;

wherein a branched fiber is provided to facilitate separate paths for the light emitted from the plurality of light emitting elements for measuring of the wavelengths and the irradiating of the plurality of light emitting elements from the light source.

15. A computer-readable storage medium having stored thereon a program that, when executed by a computer, causes the computer to perform operations comprising:

radiating light by an optical system irradiating a plurality of light emitting elements to be tested with light emitted from a light source;

performing electrical measurement by measuring a photoelectric signal obtained by each of the plurality of light emitting elements photoelectrically converting the light radiated by the optical system;

controlling light emission by causing the plurality of light emitting elements to emit light;

measuring light by receiving the light emitted from the plurality of light emitting elements via the optical system and measuring wavelengths of the received light; and determining quality of the plurality of light emitting elements on a basis of a measurement result of at least one of the performing the electrical measurement and the measuring the light;

wherein a branched fiber is provided to facilitate separate paths for the light emitted from the plurality of light emitting elements for measuring of the wavelengths and the irradiating of the plurality of light emitting elements from the light source.

* * * * *